US010371750B1

(12) United States Patent
Douskey et al.

(10) Patent No.: US 10,371,750 B1
(45) Date of Patent: *Aug. 6, 2019

(54) MINIMIZATION OF OVER-MASKING IN AN ON PRODUCT MULTIPLE INPUT SIGNATURE REGISTER (OPMISR)

(71) Applicant: International Business Machines Corporation, Armonk, NY (US)

(72) Inventors: Steven M. Douskey, Rochester, MN (US); Mary P. Kusko, Hopewell Junction, NY (US); Matthew B. Schallhorn, Greensboro, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/119,605

(22) Filed: Aug. 31, 2018

(51) Int. Cl.
*G06F 17/50* (2006.01)
*G01R 31/3177* (2006.01)

(52) U.S. Cl.
CPC ........ *G01R 31/3177* (2013.01); *G06F 17/505* (2013.01)

(58) Field of Classification Search
CPC ........ G01R 31/3177; G01R 31/318544; G01R 31/3172; G01R 31/318541; G01R 31/318552; G01R 31/31704; G01F 17/505

See application file for complete search history.

(56) References Cited

U.S. PATENT DOCUMENTS

| 6,715,105 | B1 | 3/2004 | Rearick | |
|---|---|---|---|---|
| 6,807,645 | B2* | 10/2004 | Angelotti | G01R 31/31813 714/729 |
| 7,032,148 | B2* | 4/2006 | Wang | G01R 31/318536 714/726 |
| 7,461,309 | B2* | 12/2008 | Kiryu | G01R 31/318544 714/724 |
| 7,500,163 | B2* | 3/2009 | Rajski | G01R 31/318547 714/729 |
| 7,509,551 | B2* | 3/2009 | Koenemann | G01R 31/31703 714/732 |

(Continued)

OTHER PUBLICATIONS

S. Ohtake and D. Shimazu, "An approach to LFSR-based X-masking for built-in self-test," 2017 18th IEEE Latin American Test Symposium (LATS), Bogota, 2017, pp. 1-4.*

(Continued)

*Primary Examiner* — Cynthia Britt
(74) *Attorney, Agent, or Firm* — Joan Pennington (57) ABSTRACT

A method and test circuit are provided for implementing enhanced scan data testing with minimization of over masking in an on product multiple input signature register (OPMISR) test, and a design structure on which the subject circuit resides. Common Channel Mask Scan Registers (CMSR) data is used with a multiple input signature register (MISR) in each satellite. A test algorithm control is used for implementing enhanced scan data testing by independently skewing scan unload shifting of selected OPMISR+ satellite by selected cycles. With this modified shifting, for the same test or a repeated run of the test, Channel Mask Enable (CME) triggered masking lines up on a different bit position in channels of each satellite avoiding over masking.

20 Claims, 10 Drawing Sheets

(56) References Cited

U.S. PATENT DOCUMENTS

| | | | | |
|---|---|---|---|---|
| 7,523,370 | B1* | 4/2009 | Keller | G01R 31/318547 714/726 |
| 7,823,034 | B2* | 10/2010 | Wohl | G01R 31/318547 714/726 |
| 8,006,150 | B2 | 8/2011 | Sinanoglu et al. | |
| 8,086,923 | B2* | 12/2011 | Cheng | G01R 31/31813 714/726 |
| 8,103,926 | B2 | 1/2012 | Gizdarski | |
| 8,438,437 | B2 | 5/2013 | Jain et al. | |
| 9,355,203 | B2* | 5/2016 | Douskey | G06F 17/5072 |
| 9,448,282 | B1 | 9/2016 | Meehl | |
| 9,702,934 | B1* | 7/2017 | Meehl | G01R 31/318335 |
| 2009/0300446 | A1* | 12/2009 | Rajski | G01R 31/318547 714/726 |
| 2012/0278672 | A1* | 11/2012 | Sinanoglu | G01R 31/318547 714/726 |
| 2016/0341795 | A1* | 11/2016 | Chandra | G01R 31/318536 |

OTHER PUBLICATIONS

B. Keller, "Encounter test OPMISR/sup +/ on-chip compression," IEEE International Conference on Test, 2005., Austin, TX, 2005, pp. 2 pp. 1287.*

J. Kang, N. A. Touba and J. Yang, "Reducing control bit overhead for X-masking/X-canceling hybrid architecture via pattern partitioning," 2016 53nd ACM/EDAC/IEEE Design Automation Conference (DAC), Austin, TX, 2016, pp. 1-6.*

O. Sinanoglu, "Toggle-Based Masking Scheme for Clustered Unknown Response Bits," 2011 Sixteenth IEEE European Test Symposium, Trondheim, 2011, pp. 105-110.*

C. Barnhart, V. Brunkhorst, F. Distler, O. Farnsworth, B. Keller and B. Koenemann, "OPMISR: the foundation for compressed ATPG vectors," Proceedings International Test Conference 2001 (Cat. No. 01CH37260), Baltimore, MD, USA, 2001, pp. 748-757.*

S. Kim, J. Chung and J. Yang, "Mitigating Observability Loss of Toggle-BasedX-Masking via Scan Chain Partitioning," in IEEE Transactions on Computers, vol. 67, No. 8, pp. 1184-1192, Aug. 1, 2018.*

Carter, JL, "Improved Signature Test for VLSI Circuits," IPCOM000046557D, IP.com, IBM TDB, Aug. 1, 1983, pp. 965-967.

Hilscher et al., "X-Tolerant Test Data Compaction with Accelerated Shift Registers," Journal of Electronic Testing 25.4-5 (2009): 247-258.

Appendix P List of Patents and Patent Applications Treated as Related Feb. 6, 2019.

* cited by examiner

| B0 | B1 | FUNCTION |
|----|----|----------|
| 0 | 0 | NO MASKING (MISR ENABLED) |
| 0 | 1 | MASK USING REGISTER0 (MISR ENABLED) |
| 1 | 0 | MASK USING REGISTER1 (MISR ENABLED) |
| 1 | 1 | GLOBAL MISR MASK ALL CHANNELS |

| CME | POS | S1 C1 | S1 C2 | S1 C3 | S2 POS | S2 C1 | S2 C2 | S2 C3 | SE POS | S3 C1 | S3 C2 | S3 C3 |
|---|---|---|---|---|---|---|---|---|---|---|---|---|
| CME2 | 1 |  | 2 | X | 1 |  |  |  | 1 |  |  |  |
| CME1 | 2 |  | 1 |  | 2 |  | X | 1 | 2 |  |  |  |
|  | 3 |  |  |  | 3 |  |  |  | 3 |  |  |  |
| CME1 | 4 |  | 1 |  | 4 |  | 1 | X | 4 |  |  |  |
|  | 5 |  |  |  | 5 |  |  |  | 5 |  |  |  |
| CME2 | 6 |  | X | 2 | 6 |  |  |  | 6 |  | X | 2 |
|  | 7 |  |  |  | 7 |  |  |  | 7 |  |  |  |
|  | 8 |  |  |  | 8 |  |  |  | 8 |  |  |  |
|  | 9 |  |  |  | 9 |  |  |  | 9 |  |  |  |
|  | 10 |  |  |  | 10 |  |  |  | 10 |  |  |  |
|  | 11 |  |  |  | 11 |  |  |  | 11 |  |  |  |
|  | 12 |  |  |  | 12 |  |  |  | 12 |  |  |  |
| CME1 | 13 |  | X |  | 13 |  | 1 | 1 | 13 |  |  |  |
| CME1 | 14 |  | X |  | 14 |  | 1 | 1 | 14 |  |  |  |
| CME1 | 15 |  | X |  | 15 |  | 1 | 1 | 15 |  |  |  |
| CME1 | 16 |  | X |  | 16 |  | 1 | 1 | 16 |  |  |  |
| CME2 | 17 |  | 2 | 2 | 17 |  |  |  | 17 |  | 2 | X |

| CME | S1 POS | S1 C1 | S1 C2 | S1 C3 | S2 POS | S2 C1 | S2 C2 | S2 C3 | S3 POS | S3 C1 | S3 C2 | S3 C3 |
|---|---|---|---|---|---|---|---|---|---|---|---|---|
|  | 1 |  | 2 | X |  | 0 | 0 | 0 | 1 |  | 2 | 2 |
|  | 2 |  | A |  |  | 0 | 0 | 0 | 2 |  |  |  |
|  | 3 |  |  |  |  | 0 | 0 | 0 | 3 |  |  |  |
|  | 4 |  | A |  |  | 0 | 0 | 0 | 4 |  |  |  |
|  | 5 |  |  |  |  |  |  |  | 5 |  |  |  |
| CME2 | 6 |  | X | 2 | 1 |  |  |  | 6 |  | X | 2 |
| CME1 | 7 |  |  |  | 2 |  | X | 1 | 7 |  |  |  |
| CME1 | 8 |  |  |  | 3 |  |  |  | 8 |  |  |  |
|  | 9 |  |  |  | 4 |  | 1 | X | 9 |  |  |  |
| CME2 | 10 |  |  |  | 5 |  |  |  | 10 |  |  |  |
|  | 11 |  |  |  | 6 |  |  |  | 11 |  |  |  |
|  | 12 |  |  |  | 7 |  |  |  | 12 |  |  |  |
| CME1 | 13 |  | X |  | 8 |  | 1 | 1 | 13 |  |  |  |
| CME1 | 14 |  | X |  | 9 |  | 1 | 1 | 14 |  |  |  |
| CME1 | 15 |  | X |  | 10 |  | 1 | 1 | 15 |  |  |  |
| CME1 | 16 |  | X |  | 11 |  | 1 | 1 | 16 |  |  |  |
|  | 17 |  | 2 | 2 | 12 |  | A | A | 17 |  | 2 | X |
|  | 18 |  |  |  | 13 |  | A | A |  |  |  |  |
|  | 19 |  |  |  | 14 |  | A | A |  |  |  |  |
|  | 20 |  |  |  | 15 |  | A | A |  |  |  |  |
| CME2 | 21 |  |  |  | 16 |  |  |  |  |  |  |  |
|  | 22 |  |  |  | 17 |  |  |  |  |  |  |  |

| CME | S1 POS | S1 C1 | S1 C2 | S1 C3 | S2 POS | S2 C1 | S2 C2 | S2 C3 | S3 POS | S3 C1 | S3 C2 | S3 C3 |
|---|---|---|---|---|---|---|---|---|---|---|---|---|
|  | 1 |  | 2 | X |  | 0 | 0 | 0 |  | 0 | 0 | 0 |
|  | 2 |  | A |  |  | 0 | 0 | 0 |  | 0 | 0 | 0 |
|  | 3 |  |  |  |  | 0 | 0 | 0 | 1 |  | B | B |
|  | 4 |  | A |  |  | 0 | 0 | 0 | 2 |  |  |  |
|  | 5 |  |  |  |  | 0 | 0 | 0 | 3 |  |  |  |
| CME2 | 6 |  | X | 2 | 1 |  |  |  | 4 |  | 2 | 2 |
| CME1 | 7 |  | 1 |  | 2 |  | X | 1 | 5 |  |  |  |
| CME2 | 8 |  | 2 | 2 | 3 |  |  |  | 6 |  | X | 2 |
| CME1 | 9 |  | 1 |  | 4 |  | 1 | X | 7 |  |  |  |
|  | 10 |  |  |  | 5 |  |  |  | 8 |  |  |  |
|  | 11 |  |  |  | 6 |  |  |  | 9 |  |  |  |
|  | 12 |  |  |  | 7 |  |  |  | 10 |  |  |  |
| CME1 | 13 |  | X |  | 8 |  | 1 | 1 | 11 |  |  |  |
| CME1 | 14 |  | X |  | 9 |  | 1 | 1 | 12 |  |  |  |
| CME1 | 15 |  | X |  | 10 |  | 1 | 1 | 13 |  |  |  |
| CME1 | 16 |  | X |  | 11 |  | 1 | 1 | 14 |  |  |  |
|  | 17 |  | B | B | 12 |  | A | A | 15 |  |  |  |
|  | 18 |  |  |  | 13 |  | A | A | 16 |  |  |  |
| CME2 | 19 |  | 2 | 2 | 14 |  | A | A | 17 |  | 2 | X |
|  | 20 |  |  |  | 15 |  | A | A | 18 |  |  |  |
|  | 21 |  |  |  | 16 |  |  |  | 19 |  |  |  |
|  | 22 |  |  |  | 17 |  |  |  | 20 |  |  |  |

| CME | S1 POS | S1 C1 | S1 C2 | S1 C3 | S2 POS | S2 C1 | S2 C2 | S2 C3 | S3 POS | S3 C1 | S3 C2 | S3 C3 |
|---|---|---|---|---|---|---|---|---|---|---|---|---|
|  | 0 | 0 | 0 | 0 | 1 |  |  |  | 1 |  |  |  |
| CME1 | 0 | 0 | 0 | 0 | 2 |  | X | 1 | 2 |  |  |  |
|  | 0 | 0 | 0 | 0 | 3 |  |  |  | 3 |  |  |  |
| CME1 | 0 | 0 | 0 | 0 | 4 |  | 1 | X | 4 |  |  |  |
|  | 0 | 0 | 0 | 0 | 5 |  |  |  | 5 |  |  |  |
| CME2 | 1 |  | 2 | X | 6 |  |  |  | 6 |  | X | 2 |
|  | 2 |  | 1 |  | 7 |  |  |  | 7 |  |  |  |
|  | 3 |  |  |  | 8 |  |  |  | 8 |  |  |  |
|  | 4 |  | 1 |  | 9 |  |  |  | 9 |  |  |  |
|  | 5 |  |  |  | 10 |  |  |  | 10 |  |  |  |
| CME2 | 6 |  | X | 2 | 11 |  |  |  | 11 |  | 2 | 2 |
|  | 7 |  |  |  | 12 |  |  |  | 12 |  |  |  |
|  | 8 |  |  |  | 13 |  | A | A | 13 |  |  |  |
|  | 9 |  |  |  | 14 |  | A | A | 14 |  |  |  |
|  | 10 |  |  |  | 15 |  | A | A | 15 |  |  |  |
|  | 11 |  |  |  | 16 |  | A | A | 16 |  |  |  |
| CME2 | 12 |  | 2 | 2 | 17 |  |  |  | 17 |  | 2 | X |
| CME1 | 13 |  | X |  | 18 |  | 1 | 1 | 18 |  |  |  |
| CME1 | 14 |  | X |  | 19 |  | 1 | 1 | 19 |  |  |  |
| CME1 | 15 |  | X |  | 20 |  | 1 | 1 | 20 |  |  |  |
| CME1 | 16 |  | X |  | 21 |  | 1 | 1 | 21 |  |  |  |
|  | 17 |  | B | B | 22 |  |  |  | 22 |  |  |  |

MINIMIZATION OF OVER-MASKING IN AN ON PRODUCT MULTIPLE INPUT SIGNATURE REGISTER (OPMISR)

FIELD OF THE INVENTION

The present invention relates generally to the data processing field, and more particularly, relates to a method and circuit for implementing enhanced scan data testing with minimization of over masking in an on product multiple input signature register (OPMISR) test due to channel mask scan register (CMSR) data sharing, and a design structure on which the subject circuit resides.

BACKGROUND

Circuits typically are prone to defects introduced during a manufacturing process. To test for defects, a scan input may be applied to scan channels, clocks triggered and the result of the scan outputs from the scan channels may be analyzed. The test may include large numbers and variations of scan inputs being applied to scan channels of the circuit. Typically the tests take a great amount of time, produce large amounts of data for analysis, and require large amounts of resources for that analysis.

As Application Specific Integrated Circuit (ASIC) and Processor chips continue to get larger, test data volume and test time naturally increase as well. It continually becomes even more important to increase test efficiency. One method to increase efficiency is to deliver scan data in parallel to many parts of the chip at once, usually through a fan-out network feeding to many channels, which in turn feed a section of logic on the chip, and have that accompanied with a Multiple Input Signature Register (MISR) for on-chip data compression. This technique is called On Product Multiple Input Signature Register (OPMISR). This also includes a method for masking specific data in the channels, which can be used to prevent possible corruption of the MISR. This method for masking specific data in the channels including an OPMISR+ and OPMISR++ test versions were developed and are supported by Cadence Corporation.

Typically, OPMISR masking has two mask latches per MISR bit that are referred to as Channel Mask Scan Bits in Channel Mask Scan Registers (CMSRs) and two Channel Mask Enable (CME) signals. The CME signals decode to four states of: no masking, use mask bit 1, use mask bit 2, or mask all channels. The masking is applied as the data is unloaded from the channel into the MISR. When a bit position in a channel is going to shift into the MISR, the global CME signal is set to the desired mask state. For example, if channel 3 needs scan position 28 to be ignored, when bit 28 of the channel is about to be shifted into the MISR during the unload, the CME signals could be set to use mask register 1. The channel 3 mask scan bit in mask register 1 would have previously been set to mask. Other mask bits for other channels may or may not have been set to mask based on needs for the rest of the scan unload.

In large complex processors there can be more than one MISR. As used in the following description and claims, an OPMISR+ satellite includes one MISR and the channels above the MISR. With common Channel Mask Scan Registers (CMSRs) scanned into multiple OPMISR+ satellites and a global pair of Channel Mask Enable (CME) signals, typically there is over masking in OPMISR+ test patterns, which reduces the effectiveness of the patterns. It can be more practical to have several of these OPMISR+ satellites spread throughout the chip. For most efficient scanning and less scan data, the Channel Mask Scan Bits for register 0 and register 1 are scan initialized in parallel and shared across satellites. However, this means all satellites have the same mask bits. Additionally, typically all satellites get the same CME information during unload. For example, assume the first satellite needed bit 4 of the channel mask scan register set and used at the scan position 28 but the second satellite did not. With both satellites receiving the same data for the channel mask scan register the bit in the second satellite would unnecessarily be masked at the same time as the bit in the first mask register.

Thus, while it is efficient to share channel mask enable pins, one is left with the problem of over masking. All the channels with their mask bit set are masked whenever the CME signals indicates to use that masking, even if that bit position was needed to be masked on just one channel in just one satellite.

SUMMARY OF THE INVENTION

Principal aspects of the present invention are to provide a method and test circuit for implementing enhanced scan data testing with minimization of over masking in an on product multiple input signature register (OPMISR) test, and a design structure on which the subject circuit resides. Other important aspects of the present invention are to provide such method and circuit substantially without negative effects and that overcome many of the disadvantages of prior art arrangements.

In brief, a method and test circuit are provided for implementing enhanced scan data testing with minimization of over masking in an on product multiple input signature register (OPMISR) test, and a design structure on which the subject circuit resides. Common Channel Mask Scan Registers (CMSR) data is used with a multiple input signature register (MISR) in each satellite. A test algorithm control is used for implementing enhanced scan data testing by independently skewing scan unload shifting of selected OPMISR+ satellite by selected cycles. With this modified shifting, for the same test or a repeated run of the test, Channel Mask Enable (CME) triggered masking lines up on a different bit position in channels of each satellite avoiding over masking.

In accordance with features of the invention, enhanced scan data testing is effectively and efficiently implemented, enabling data volume reduction and minimizing over masking.

In accordance with features of the invention, first a satellite with a longest masking string or most masking is selected to use as a base. For example with three satellites 1, 2, and 3, satellite 1 having the longest masking string (bit 13-16) and most masking is selected, so satellites 2 and 3 will have the scan unload skewed. The original masking needs of satellites 2 and 3 still exist and much of the original over masking is removed.

In accordance with features of the invention, when some over masking locations of satellites 2 and 3 were not fixed by the first scan unload skewing, another adjustment of scan unload skewing to satellite 2 or 3 is provided.

In accordance with features of the invention, the selection of which satellite to shift is somewhat arbitrary. For example, rather than shift both satellites 2 and 3 by a number of bits, such as 4 bits, satellite 1 could be shifted by 4 for very similar results. The next adjustment may shift only one of the remaining satellites 2 and 3 or satellite 1 and shifting one of the satellites 1, 2, and 3 again for similar results.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and circuit are provided for implementing enhanced scan data testing with minimization of over masking in an on product multiple input signature register (OPMISR) test, and a design structure on which the subject circuit resides. A common Channel Mask Scan Registers (CMSR) logic is used with a multiple input signature register (MISR). An algorithm is used for implementing enhanced scan data testing by independently skewing or shifting of a scan unload of each OPMISR+ satellite by several cycles. With this modified shifting, for the same test or a repeated run of the test, a Channel Mask Enable (CME) triggered masking lines up on a different bit position in channels of each satellite for avoiding over masking.

Figure 1:
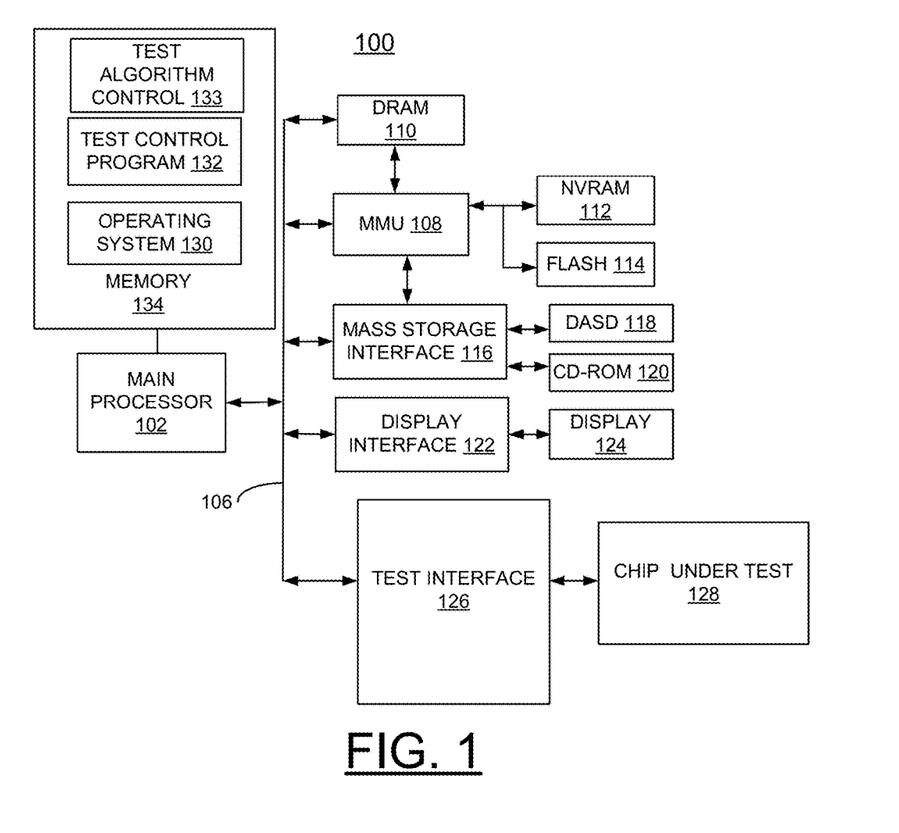
FIG. 1 is a block diagram representation illustrating an example computer test system for implementing enhanced scan data testing with over masking minimization in an on product multiple input signature register (OPMISR) test, and a design structure on which the subject circuit resides in accordance with the preferred embodiment.

With reference now to the drawings, in FIG. 1, there is shown an exemplary computer test system for implementing enhanced scan data testing with minimization of over masking in an on product multiple input signature register (OPMISR) test generally designated by the reference character 100 in accordance with the preferred embodiment. Computer system 100 includes a main processor 102 or central processor unit (CPU) 102 coupled by a system bus 106 to a memory management unit (MMU) 108 and system memory including a dynamic random access memory (DRAM) 110, a nonvolatile random access memory (NVRAM) 112, and a flash memory 114. A mass storage interface 116 coupled to the system bus 106 and MMU 108 connects a direct access storage device (DASD) 118 and a CD-ROM drive 120 to the main processor 102. Computer system 100 includes a display interface 122 connected to a display 124, and a test interface 126 coupled to the system bus 106. An integrated circuit device or chip under test 128 is coupled to the test interface 126. Computer system 100 includes an operating system 130, and a test control program 132 and a test algorithm control 133 of the preferred embodiment resident in a memory 134.

Computer test system 100 is shown in simplified form sufficient for understanding the present invention. The illustrated computer test system 100 is not intended to imply architectural or functional limitations. The present invention can be used with various hardware implementations and systems and various other internal hardware devices, for example, multiple main processors.

Figure 2A:
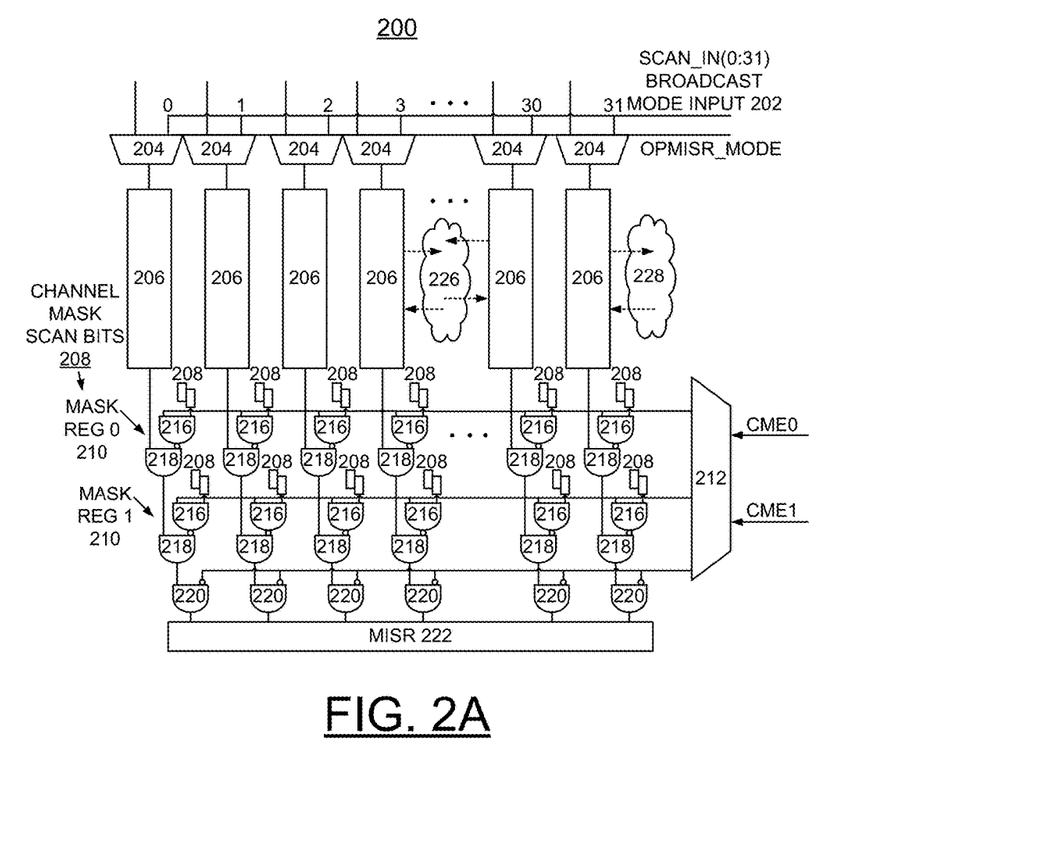
FIGS. 2A and 2B respectively illustrate an example on product multiple input signature register (OPMISR) test circuit in accordance with preferred embodiments of the invention.
Figure 2B:
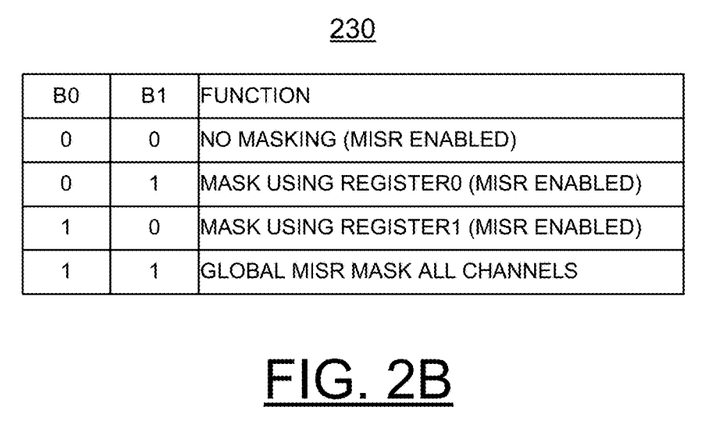

Referring now to FIGS. 2A and 2B, there is shown an example on product multiple input signature register (OPMISR) test circuit generally designated by the reference character 200 in accordance with preferred embodiments of the invention. The OPMISR test circuit 200 provides channel input patterns via a respective multiplexer 204 to a respective associated scan channel 206 used for the OPMISR scan data testing. A scan-in (0:31) broadcast mode input 202 is selectively coupled by the respective multiplexer 204 responsive to an OPMISR_MODE control input applied to the multiplexers 204. The OPMISR test circuit 200 includes OPMISR masking including two mask latches per MISR bit (referred to as Channel Mask Scan Bits 208 in Channel Mask Scan Registers (CMSRs) 0, 1, 210 and two Channel Mask Enable (CME) signals CME0, CME1 applied to CME logic 212. Each of the channel Mask Scan Registers (CMSRs) 0, 1, 210 include a respective pair of AND gates 216, 218 with an inverted output of AND gate 216 applied to AND gate 218. A respective AND gate 220 coupled to an output of AND gate 218 of mask register 1, 210 and an inverted logic output of CME logic 212 couples a respective channel bit position (0:31) to a Multiple Input Signature Register (MISR) 222 for on-chip data compression. Clouds 226, 228 represent the logic under test that while usually produce predictable data, they may also produce unpredictable values in the channels that require masking.

Referring to FIG. 2B, an example CME function table 230 is shown. For example, the CME signals decode to four states of: no masking (B0, B1: 0 0), use mask register 0 (B0, B1: 0 1), use mask register 1 (B0, B1: 1 0), or global MISR mask all channels (B0, B1: 1 1). The masking is applied as the data is unloaded from the respective channels 206 into the MISR 222. When a bit position in a channel is going to shift into the MISR, the global CME signal is set to the desired mask state. For example, if channel 3 needs scan position 28 to be ignored, when bit 28 of the channel is about to be shifted into the MISR during the unload, the CME signals could be set to use mask register 1. The channel 3 mask scan bit in mask register 1 would have previously been set to mask. Other mask bits for other channels may or may not have been set to mask based on needs for the rest of the scan data unload.

There advantageously can be multiple OPMISR satellites or OPMISR test circuits 200 spread throughout the chip under test. For most efficient scanning and less scan data, the Channel Mask Scan Bits 208 for register 0, 210 and register 1, 210 are scan initialized in parallel and shared across satellites. However this means all satellites have the same mask bits. Additionally, all satellites usually get the same CME information during unload. For the example above, if the first satellite needed bit 4 of the channel mask scan register set and used at the scan position 28 but the second satellite did not, the second satellite would unnecessarily be masked at the same time as the bit in the first register, since both satellites receive the same data for the channel mask scan register. Thus, while it is efficient to share channel mask scan register data, one is left with the problem of over masking. All the channels with their mask bit set will be masked whenever the CME signals say to use that masking, even if only one channel in one satellite needed that bit position masked.

Figure 3:
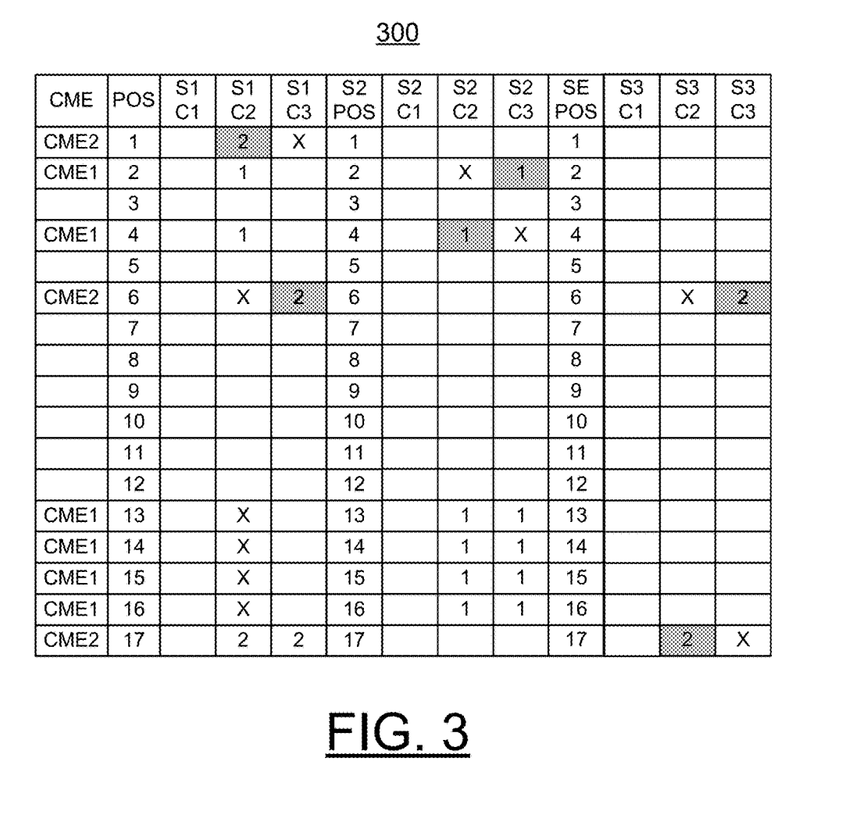
FIG. 3 illustrates an example group of OPMISR channels and three satellites S1, S2, and S3 and scan channels C1, C2 and C3 for each of the respective satellites with X's representing the masking required by each and first '1' in blocks representing the resulting CME1 over masking, second '2' labeled blocks representing CME2 over masking, and third shaded blocks representing internal satellite over masking that is not correctable in accordance with preferred embodiments of the invention.

Referring now to FIG. 3, there is shown an example group of OPMISR channels for three satellites S1, S2, and S3 and scan channels C1, C2 and C3 for each of the respective satellites generally designated by the reference character 300 with X's representing the masking required by each channel, first blocks labeled '1' or '2' representing the resulting over masking due to CMSR broadcast or global CME and second shaded blocks representing internal satellite over masking which is not correctable in accordance with preferred embodiments of the invention.

In accordance with features of the invention, the algorithm for testing first selects the satellite with the longest string or most masking to use as the base. In example 300 of FIG. 3, Satellite 1 has the longest string (bit 13-16) and most masking, so satellite 2 and 3 will have the scan unload skewed.

Figure 4:
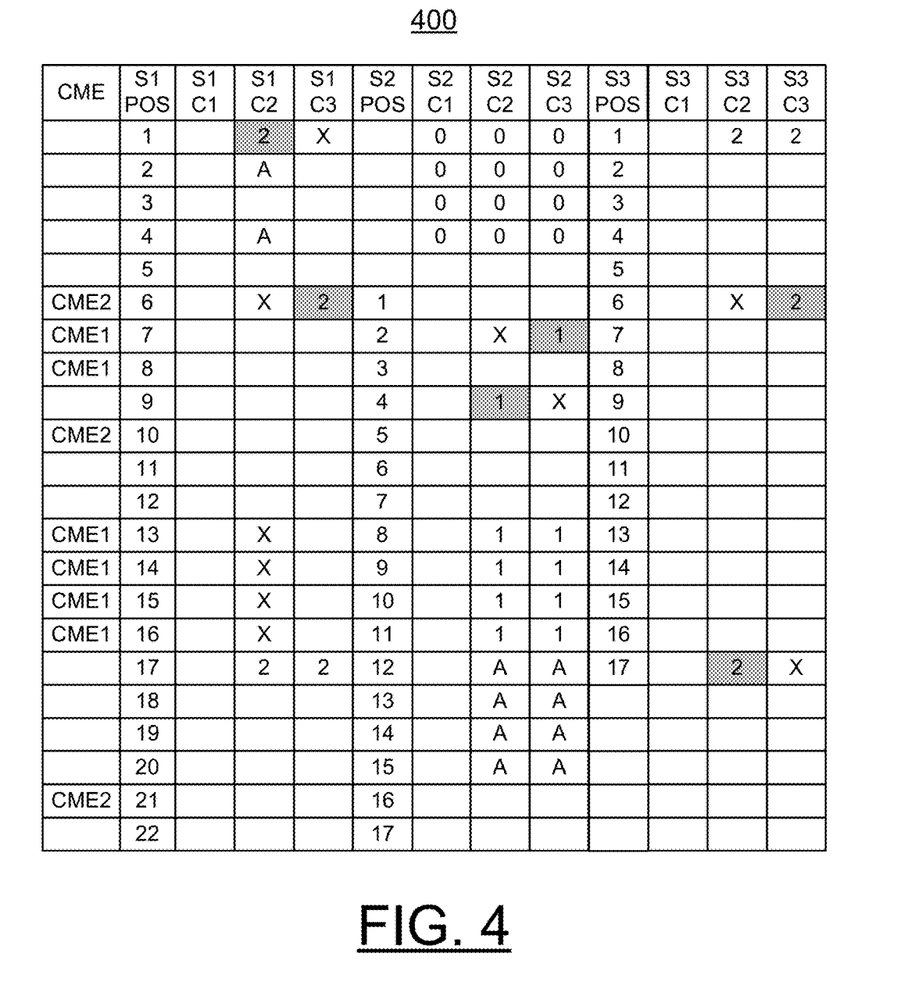
FIG. 4 illustrates the example group of OPMISR channels of FIG. 3 after the algorithm first selecting first satellite with the longest string or most masking required to use as a base and after shifting satellites S2, with the 'A' labeled blocks representing the old over masking of FIG. 3, second '1' labeled blocks representing new CME1 over masking, third '2' labeled blocks representing CME2 over masking, and fourth shaded blocks representing internal satellite over masking that is not correctable in accordance with preferred embodiments of the invention.

Referring now to FIG. 4, there is shown the example group of OPMISR channels generally designated by the reference character 400 of FIG. 4 after the algorithm first selecting first satellite with the longest string or most masking required to use as a base and after shifting satellite S2 with the first blocks labeled 'A' representing the old over masking of FIG. 3 that moved, second blocks labeled '1' representing new CME1 over masking, third blocks labeled '2' representing the CME2 over masking, and fourth shaded blocks representing internal satellite over masking which is not correctable in accordance with preferred embodiments of the invention. A first attempt settles on a legal shift of satellite S2 by 5 as shown in FIG. 4. The original masking needs still exist and are shown with an arrow labeled X. This removes a lot of the original over masking as shown in by the blocks labeled 'a', such as satellite S1 at C2 POS 4 and S2 at C2 POS 12. A legal shift results in non-conflicting CMEs at all scan positions. For example a shift of S2 by 4 would have resulted in a need for CME1 and CME2 both at S1 POS 6 which is illegal. In this case the new over masking shown with blocks labeled '1' is in new locations that were not over masked originally, such as satellite S1 at C2 POS 7. However, there are still some over masking locations that were not fixed shown in the unshaded blocks labeled '2', such as satellite S1 at C2 POS 17 and satellite S3 at C3 POS 1. Another adjustment to satellite 3 is required. Note that this next shift might produce yet another test, if it recreates over masking in satellite 1 or 2, or it can simply replace this shifted test if it creates a better overall solution.

Figure 5A:
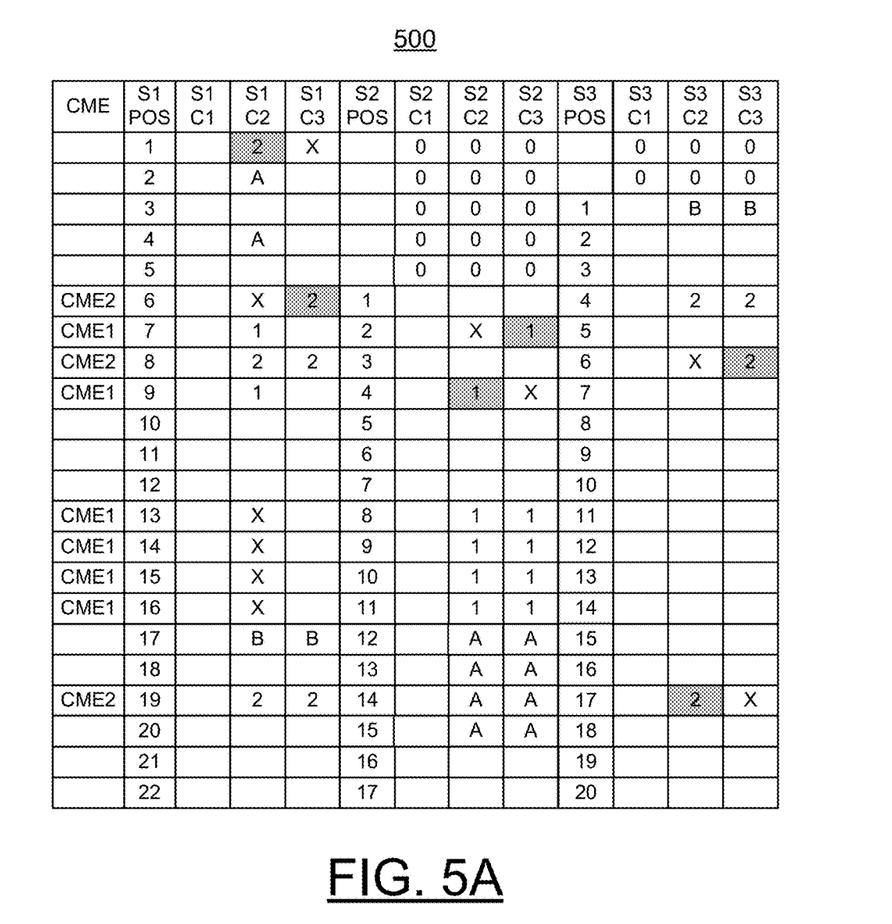
FIG. 5A illustrates the example group of OPMISR channels of FIG. 3 after shifting satellite S3 by two first, then satellite S2 by five with the 'A' labeled blocks representing the old CME1 over masking of FIGS. 3 and 4, second 'B' labeled blocks representing the old CME2 over masking of FIGS. 3 and 4, third '1' labeled blocks representing the new CME1 over masking, fourth '2' labeled blocks representing the new CME2 over masking, and fifth shaded blocks representing internal satellite over masking that is not correctable in accordance with preferred embodiments of the invention.

Referring now to FIG. 5A, there is shown the example group of OPMISR channels generally designated by the reference character 500 of FIG. 5A after shifting satellite S2 by five first, then satellite S3 shifted by two with the blocks labeled 'A' and 'B' representing the old over masking of FIGS. 3 and 4, second unshaded blocks labeled '1' or '2' representing new over masking and third shaded blocks representing internal satellite over masking which is not correctable in accordance with preferred embodiments of the invention. With this shift, all of the old over masking is now in new locations that were not masked in the original pattern. The combination of the original pattern and this single new pattern will have all of observe points that do not need masking feed into the MISR, thus all detection points are allowed to effect the MISR in one or the other pattern. Note that the CME pins are adjusted per the need of the new pattern.

Note that the selection of which satellite to shift is somewhat arbitrary. For example rather than shift both satellite S2 and S3 in the previous example of FIG. 5A, satellite S1 could have first been shifted by 5 which actually results in another valid solution, as illustrated and described with respect to FIG. 5B. It might be worth trying both styles in order to minimize patterns.

Figure 5B:
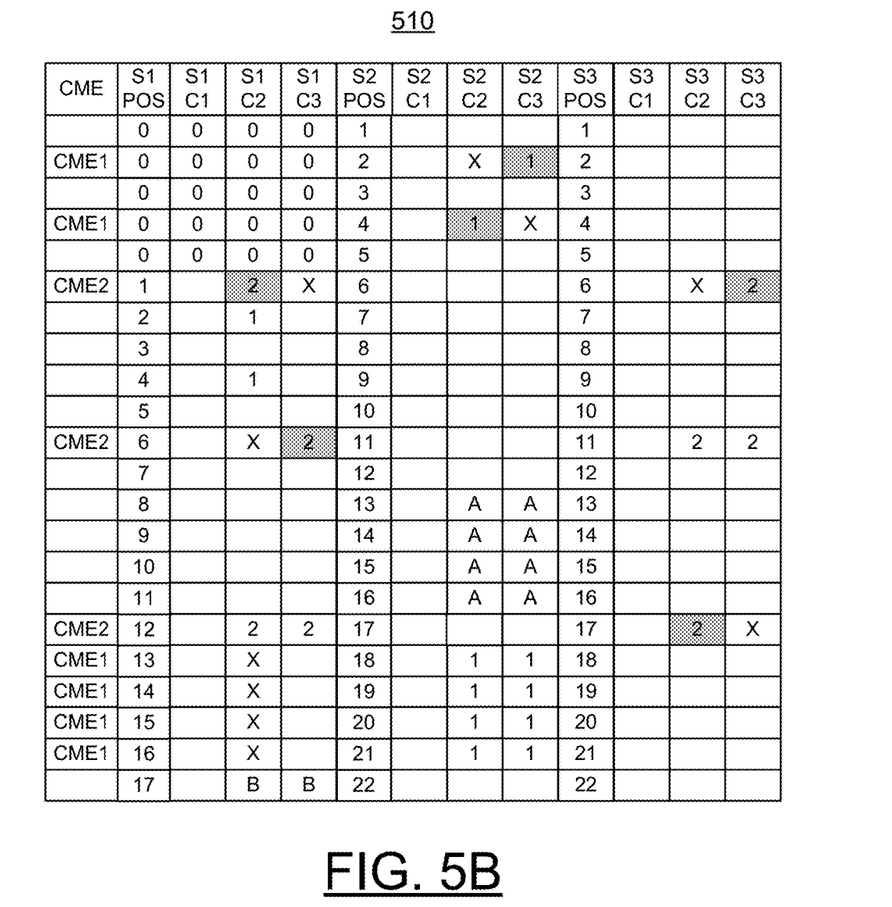
FIG. 5B illustrates an alternative solution for the example group of OPMISR channels of FIG. 3, rather than shifting both satellite S2 and S3 in the example of FIG. 5A, satellite 1 is first shifted by 5 which actually results in another valid solution in accordance with preferred embodiments of the invention.

Referring now to FIG. 5B, there is shown an alternative solution generally designated by the reference character 510 for the example group of OPMISR channels, rather than shifting both satellite S2 and S3 in the example of FIG. 5A, satellite S1 is first shifted by 5 which actually results in another valid solution in accordance with preferred embodiments of the invention. Similarly in FIG. 5B as shown in FIG. 5A, after shifting satellite S1 by five, the blocks labeled 'A' and 'B' representing the old over masking of FIGS. 3 and 4, second unshaded blocks labeled '1' or '2' representing new over masking and third shaded blocks representing internal satellite over masking which is not correctable in accordance with preferred embodiments of the invention.

Figure 6:
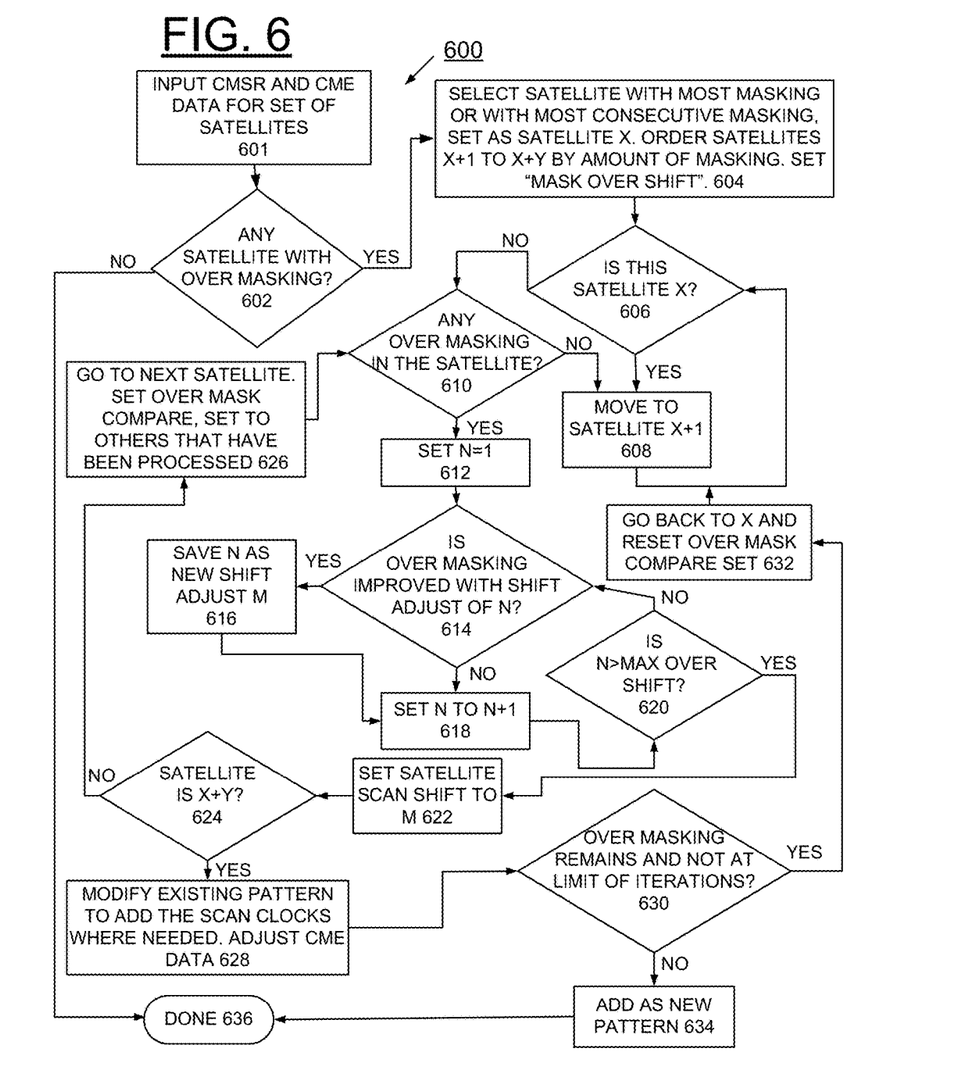
FIG. 6 is a flow chart illustrating example circuit to implement algorithm test operations in accordance with the preferred embodiments.

Referring now to FIG. 6, there is shown an example circuit functions to implement algorithm test operations generally designated by the reference character 600 starting at a block 601 with the input CMSR and CME data for a set of satellites.

In accordance with features of the invention, the algorithm for testing uses test pattern generation software analysis, locations of over masking are determined for original pattern where the scan unload for all channels is done simultaneously. If there is no over masking in the pattern, then nothing needs to be changed. If there is over masking in an OPMISR+ pattern, then chose a satellite to be the base or reference (satellite X). It could be the satellite with the most overall masking, or the one with the most bits masked consecutively. Then order the remaining satellites accordingly. Also set the "mask over shift", where this is either the maximum channel length or another lower limit.

As indicated at a decision block 602, checking for any satellite with over masking is performed. When any satellite with over masking is identified, a satellite is selected with most masking or with most consecutive masking and make this satellite X as indicated at a block 604. Then the satellites are ordered as satellites X+1 to X+Y by amount of masking, and set "mask over shift". Next iterate over the remaining satellites. As indicated at a decision block 606 checking if it is satellite X is performed. If it is satellite X do nothing and move to the next satellite X+1, as indicated at a block 608. As indicated at a decision block 610, checking if there is over masking for each satellite other than X is performed. If yes, iterate over each extra shift to the channel unload, starting with 1 by setting N=1, as indicated at a block 612. As indicated at a decision block 614, checking if the CME pattern is still legal and if there is over masking improved with shift adjust of N by comparing the new set of over masking to the old, to see if it is improved. If the current scan out shift amount improves the over masking more than a prior scan out shift amount, then save that value N as new shift adjust M, as indicated at a block 616. Otherwise if the current scan out shift amount does not improve the over masking, and after saving new shift adjust M, then move on to the next scan out shift value, set N to N+1 as indicated at a block 618.

As indicated at a decision block 620, checking if N is greater than a maximum of the channel length or other lower limit. If not, then operations return to decision block 614 and continue. When N is greater than a maximum of the channel length or other lower limit, satellite scan shift is set to M as indicated at a block 622. As indicated at a decision block 624, checking whether there are any satellites remaining or is satellite X+Y. When there are any satellites remaining, the scan out may need to be shifted on those satellites to try to fix any remaining over masking as indicated at a block 626, go to the next satellite, set over mask compare set to others that have been processed. Then operations go to decision block 610 to check for any over masking in the satellite. When there are no satellites remaining to be checked for over masking and possible scan out shifts have been added, the original pattern is modified to account for those scan out shifts, and the CME data is adjusted as indicated at a block 628.

As indicated at a decision block 630, checking if any over masking overlap with the original OPMISR pattern still remains and not at limit of iterations is performed. If yes, then go back to X and reset over mask compare set as indicated at a block 632. Then return to decision block 608 and continue to iterate over every satellite again. As indicated at a block 634, if the over masking has been eliminated, or all of the satellites have been adjusted a predetermined number of attempts, then the new OPMISR pattern is added to the test data set. Then the algorithm test operations are complete as indicated at a block 636.

Figure 7:
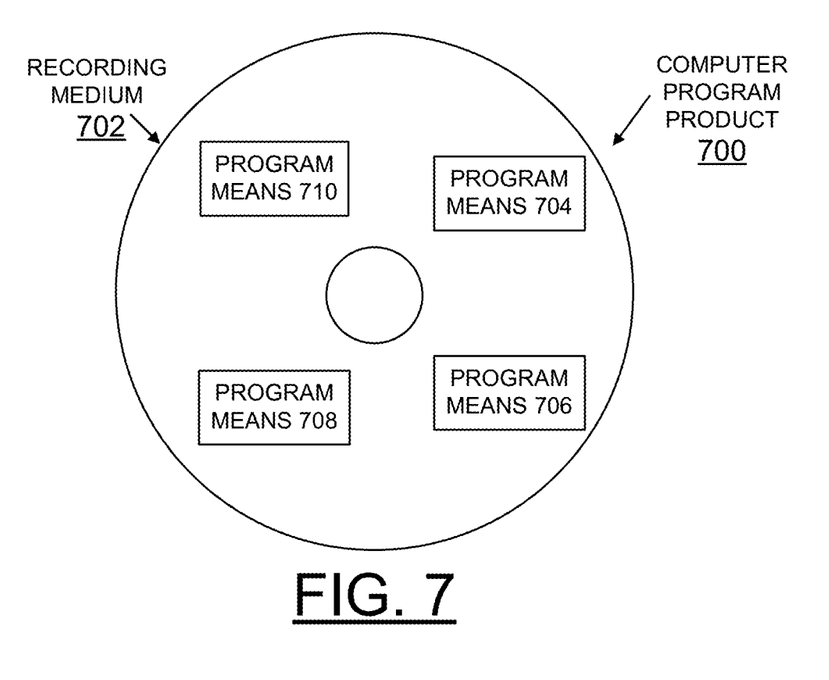
FIG. 7 is a block diagram illustrating a computer program product in accordance with the preferred embodiments.

Referring now to FIG. 7, an article of manufacture or a computer program product 700 of the invention is illustrated. The computer program product 700 includes a recording medium 702, such as, a floppy disk, a high capacity read only memory in the form of an optically read compact disk or CD-ROM, a tape, or another similar computer program product. Recording medium 702 stores program means 704, 706, 708, and 710 on the medium 702 for carrying out the methods for implementing enhanced scan data testing of the preferred embodiment in the system 100 of FIG. 1.

A sequence of program instructions or a logical assembly of one or more interrelated modules defined by the recorded program means 704, 706, 708, and 710, direct the computer system 100 for implementing enhanced scan data testing of the preferred embodiment.

Figure 8:
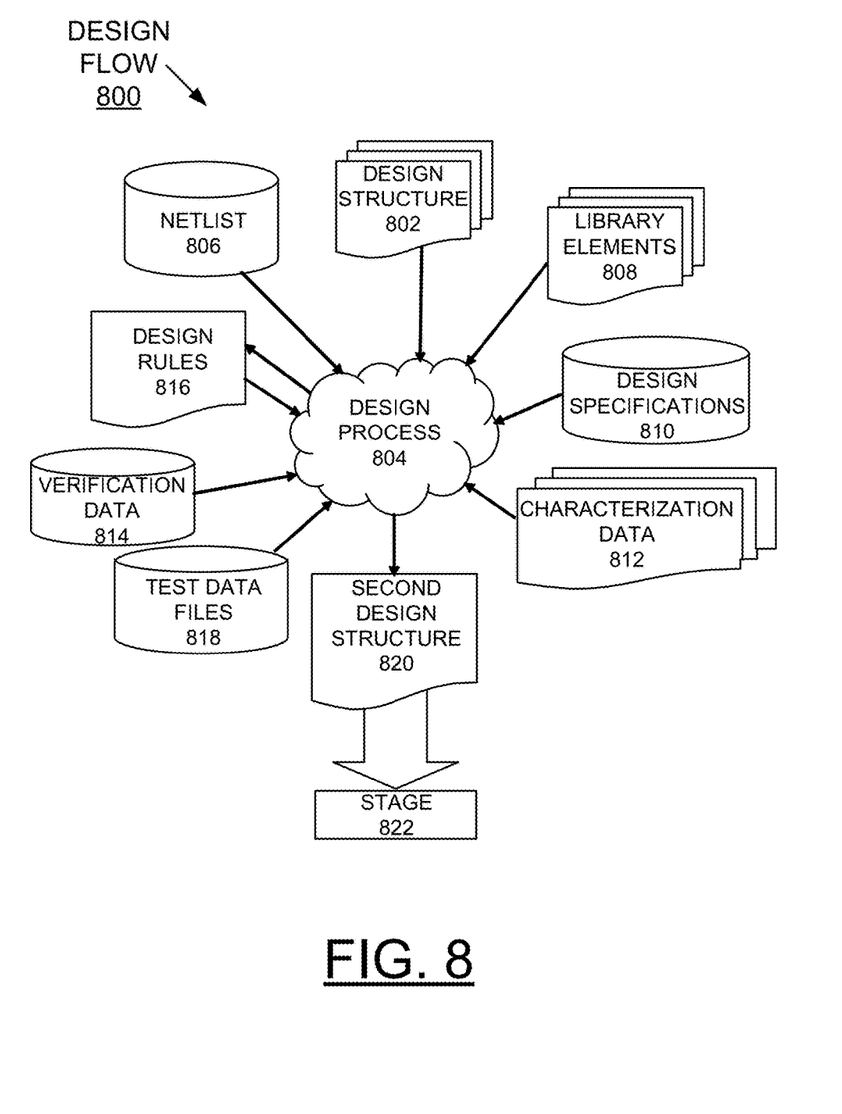
FIG. 8 is a flow diagram of a design process used in semiconductor design, manufacturing, and/or test.

FIG. 8 shows a block diagram of an example design flow 800. Design flow 800 may vary depending on the type of IC being designed. For example, a design flow 800 for building an application specific IC (ASIC) may differ from a design flow 800 for designing a standard component. Design structure 802 is preferably an input to a design process 804 and may come from an IP provider, a core developer, or other design company or may be generated by the operator of the design flow, or from other sources. Design structure 802 comprises circuits 100, 200, 600 in the form of schematics or HDL, a hardware-description language, for example, Verilog, VHDL, C, and the like. Design structure 802 may be contained on one or more machine readable medium. For example, design structure 802 may be a text file or a graphical representation of circuit 100, 200, 600. Design process 804 preferably synthesizes, or translates, circuits 100, 200, 600 into a netlist 806, where netlist 806 is, for example, a list of wires, transistors, logic gates, control circuits, I/O, models, etc. that describes the connections to other elements and circuits in an integrated circuit design and recorded on at least one of machine readable medium. This may be an iterative process in which netlist 806 is resynthesized one or more times depending on design specifications and parameters for the circuits.

Design process 804 may include using a variety of inputs; for example, inputs from library elements 808 which may house a set of commonly used elements, circuits, and devices, including models, layouts, and symbolic representations, for a given manufacturing technology, such as different technology nodes, design specifications 810, characterization data 812, verification data 814, design rules 816, and test data files 818, which may include test patterns and other testing information. Design process 804 may further include, for example, standard circuit design processes such as timing analysis, verification, design rule checking, place and route operations, and the like. One of ordinary skill in the art of integrated circuit design can appreciate the extent of possible electronic design automation tools and applications used in design process 804 without deviating from the scope and spirit of the invention. The design structure of the invention is not limited to any specific design flow.

Design process 804 preferably translates an embodiment of the invention as shown in FIGS. 1, 2A, and 6 along with any additional integrated circuit design or data (if applicable), into a second design structure 820. Design structure 820 resides on a storage medium in a data format used for the exchange of layout data of integrated circuits, for example, information stored in a GDSII (GDS2), GL1, OASIS, or any other suitable format for storing such design structures. Design structure 820 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1, 2A, and 6. Design structure 820 may then proceed to a stage 822 where, for example, design structure 820 proceeds to tape-out, is released to manufacturing, is released to a mask house, is sent to another design house, is sent back to the customer, and the like.

While the present invention has been described with reference to the details of the embodiments of the invention shown in the drawing, these details are not intended to limit the scope of the invention as claimed in the appended claims.

What is claimed is:

1. A method for implementing enhanced scan data testing with over masking minimization in an on product multiple input signature register (OPMISR) comprising:
    providing a plurality of OPMISR satellites, each of the plurality of OPMISR satellites including a multiple input signature register (MISR) for data collection and a plurality of associated scan channels;
    providing common Channel Mask Scan Registers (CMSR) data with the multiple input signature register (MISR) in each satellite;
    using an algorithm for implementing enhanced scan data testing by independently skewing scan unload shifting of selected OPMISR+ satellites by selected cycles; and
    providing Channel Mask Enable (CME) triggered masking on a different bit position in respective OPMISR+ satellite channels with the scan unload shifting for avoiding over masking.

2. The method as recited in claim 1, wherein using said algorithm for implementing enhanced scan data testing enables data volume reduction and minimizing over masking.

3. The method as recited in claim 1, wherein independently skewing scan unload shifting of selected OPMISR+ satellites by selected cycles comprises selecting a satellite with a longest masking string for most masking and using the selected OPMISR+ satellite as a base.

4. The method as recited in claim 3, further comprising identifying remaining over masking in the other OPMISR+ satellites, and providing skewing scan unload shifting of other OPMISR+ satellites by selected cycles.

5. The method as recited in claim 4, further comprising providing another skewing scan unload shifting of the other OPMISR+ satellites by selected cycles.

6. The method as recited in claim 4, wherein providing skewing scan unload shifting of other OPMISR+ satellites by selected cycles comprises selecting at least one of the other OPMISR+ satellites for scan unload shifting together with selecting a number of cycles.

7. The method as recited in claim 4, further comprising identifying remaining original over masking locations in the other OPMISR+ satellites.

8. The method as recited in claim 7, further comprising selecting at least one of the other OPMISR+ satellites for scan unload shifting together with selecting a number of cycles, and providing another adjustment in the selected at least one of the other OPMISR+ satellites.

9. The method as recited in claim 8, further comprising providing another skewing scan unload shifting of the selected at least one of the other OPMISR+ satellites by the selected cycles.

10. The method as recited in claim 9, further comprising producing an OPMISR test with a resulting new pattern.

11. A test circuit for implementing enhanced scan data testing with over masking minimization in an on product multiple input signature register (OPMISR) comprising:
    a plurality of OPMISR+ satellites, each of the plurality of OPMISR+ satellites including a multiple input signature register (MISR) for data collection and a plurality of associated scan channels; and
    a processor;
    said processor using test algorithm control logic to implement enhanced scan data testing, which when implemented causes the processor to perform the following actions:
    independently skewing scan unload shifting of selected OPMISR+ satellites by selected cycles; and
    providing Channel Mask Enable (CME) triggered masking on a different bit position in respective OPMISR+ satellite channels with the scan unload shifting for avoiding over masking.

12. The test circuit as recited in claim 11, includes control code stored on a computer readable medium, and wherein said processor uses the control code for implementing enhanced scan data testing.

13. The test circuit as recited in claim 11, wherein the test algorithm control logic to independently skew scan unload shifting of selected OPMISR+ satellites by selected cycles comprises logic to select an OPMISR+ satellite with a longest masking string for most masking and using the selected satellite as a base.

14. The test circuit as recited in claim 13, wherein the test algorithm control logic further comprises logic to identify remaining over masking in the other OPMISR+ satellites, and provide skewing scan unload shifting of other OPMISR+ satellites by selected cycles.

15. The test circuit as recited in claim 14, wherein the test algorithm control logic further comprises logic to provide another skewing scan unload shifting of the other OPMISR+ satellites by selected cycles.

16. The test circuit as recited in claim 14, wherein the logic to provide skewing scan unload shifting of other OPMISR+ satellites by selected cycles comprises logic to select at least one of other OPMISR+ satellites for scan unload shifting together with selecting a number of cycles.

17. The test circuit as recited in claim 14, wherein the test algorithm control logic further comprises logic to identify remaining original over masking locations in the other OPMISR+ satellites.

18. The test circuit as recited in claim 17, wherein the test algorithm control logic further comprises logic to select at least one of the other OPMISR+ satellites for scan unload shifting together with selecting a number of cycles, and provide another adjustment in the selected at least one of the other OPMISR+ satellites.

19. The test circuit as recited in claim 18, wherein the test algorithm control logic further comprises logic to provide another skewing scan unload shifting of the selected at least one of the other OPMISR+ satellites by the selected cycles.

20. The test circuit as recited in claim 19, wherein the test algorithm control logic further comprises logic to produce an OPMISR test with a resulting new pattern.

* * * * *